United States Patent
Zhou et al.

(10) Patent No.: US 12,387,994 B2
(45) Date of Patent: Aug. 12, 2025

(54) POWER DEVICE EMBEDDED PRINTED CIRCUIT BOARD ASSEMBLIES WITH THIN FILM DIELECTRIC LAYERS

(71) Applicant: Toyota Motor Engineering & Manufacturing North America, Inc., Plano, TX (US)

(72) Inventors: Feng Zhou, Ann Arbor, MI (US); Tianzhu Fan, Houston, TX (US); Yanghe Liu, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 277 days.

(21) Appl. No.: 18/114,576

(22) Filed: Feb. 27, 2023

(65) Prior Publication Data

US 2024/0290687 A1    Aug. 29, 2024

(51) Int. Cl.
| | |
|---|---|
| *H01L 23/42* | (2006.01) |
| *H01L 23/00* | (2006.01) |
| *H01L 23/427* | (2006.01) |
| *H05K 1/02* | (2006.01) |
| *H05K 1/18* | (2006.01) |

(52) U.S. Cl.
CPC ............ *H01L 23/427* (2013.01); *H01L 24/32* (2013.01); *H05K 1/0203* (2013.01); *H05K 1/185* (2013.01); *H01L 2224/32221* (2013.01); *H01L 2924/1011* (2013.01); *H05K 2201/064* (2013.01); *H05K 2201/10007* (2013.01)

(58) Field of Classification Search
CPC .. H05K 1/0209; H05K 1/0203; H05K 1/0201; H05K 1/185; H01L 23/427; H01L 24/32
See application file for complete search history.

(56) References Cited

U.S. PATENT DOCUMENTS

| | | | |
|---|---|---|---|
| 6,400,573 B1 * | 6/2002 | Mowatt | H05K 1/117 361/764 |
| 2012/0280385 A1 * | 11/2012 | Tain | H10D 64/254 257/737 |
| 2020/0212018 A1 | 7/2020 | Lai et al. | |
| 2021/0159217 A1 | 5/2021 | Yu et al. | |
| 2021/0202312 A1 | 7/2021 | Yu et al. | |
| 2022/0013431 A1 | 1/2022 | Zhou et al. | |
| 2022/0022323 A1 | 1/2022 | Zhou et al. | |
| 2022/0053634 A1 | 2/2022 | Zhou et al. | |
| 2022/0141951 A1 | 5/2022 | Zhou et al. | |
| 2022/0157693 A1 | 5/2022 | Zhou et al. | |

* cited by examiner

*Primary Examiner* — Jeremy C Norris
(74) *Attorney, Agent, or Firm* — Christopher G. Darrow; DARROW MUSTAFA PC (57) ABSTRACT

A power device embedded printed circuit board (PCB) assembly includes a cold plate, a multi-layer PCB with at least one power device embedded therein bonded to and in thermal communication with the cold plate, and a chemical vapor deposition (CVD) dielectric layer disposed between the cold plate and the multi-layer PCB. The CVD dielectric layer can be applied to the cold plate and a bonding layer can be sandwiched between the CVD dielectric layer and the multi-layer PCB with at least one power device assembly embedded therein. In the alternative, CVD dielectric layer can be applied top the multi-layer PCB with at least one power device assembly embedded therein and bonding layer can be sandwiched between the CVD dielectric layer and the cold plate.

20 Claims, 9 Drawing Sheets

Max_T = 135 deg C

FIG. 6A

Max_T = 134 deg C

POWER DEVICE EMBEDDED PRINTED CIRCUIT BOARD ASSEMBLIES WITH THIN FILM DIELECTRIC LAYERS

TECHNICAL FIELD

The present disclosure relates to printed circuit boards, and particularly to printed circuit boards with embedded power devices.

BACKGROUND

Printed circuit boards (PCBs) are typically used for mechanical support and electrical connection of electronic components using conductive pathways of copper sheets laminated onto a non-conductive substrate. And multi-layer PCBs with power devices embedded therein provide higher capacity and/or density of electronic components in a smaller footprint. However, the design, manufacture, and/or cooling of multi-layer PCBs with embedded power devices can be difficult.

The present disclosure addresses issues related to the manufacture and/or cooling of multi-layer PCBs with embedded power devices and other issues related to multi-layer PCBs.

SUMMARY

This section provides a general summary of the disclosure and is not a comprehensive disclosure of its full scope or all of its features.

In one form of the present disclosure, a power device embedded printed circuit board (PCB) assembly includes a cold plate, a multi-layer PCB with at least one power device embedded therein bonded to and in thermal communication with the cold plate, and a chemical vapor deposition (CVD) dielectric layer disposed between the cold plate and the multi-layer PCB.

In another form of the present disclosure, a power device embedded PCB assembly includes a cold plate, a multi-layer PCB with at least one power device embedded therein bonded to and in thermal communication with the cold plate, and a CVD dielectric layer and a bonding layer disposed between the cold plate and the multi-layer PCB.

In still another form of the present disclosure, a power device embedded PCB assembly includes a cold plate, a multi-layer PCB with at least one power device embedded therein bonded to and in thermal communication with the cold plate, and a bonding interface between and bonding the cold plate to the multi-layer PCB. Also, the bonding interface includes a CVD dielectric layer and a bonding layer.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

It should be noted that the figures set forth herein are intended to exemplify the general characteristics of the methods, devices, and systems among those of the present technology, for the purpose of the description of certain aspects. The figures may not precisely reflect the characteristics of any given aspect and are not necessarily intended to define or limit specific forms or variations within the scope of this technology.

DETAILED DESCRIPTION

The present disclosure provides highly integrated power electronics embedded PCB-cold plate assemblies with enhanced heat transfer between one or more power devices embedded in a multi-layer PCB and a cold plate bonded to the multi-layer PCB. As used herein, the phrase "highly integrated power electronics embedded PCB" refers to a single multi-layer PCB module or unit with two or more power semiconductor devices (also referred to herein simply as "power device"), control/drive/protection electronic circuitry, and passive components, embedded therein. Also, as used herein, the phrase "power device" refers to a semiconductor device used as a switch or rectifier in power electronics. The cold plate can be fluid cooled such that temperatures of the one or more power devices during operation remain below a predefined temperature. In addition, the multi-layer PCB with the one or more power devices embedded therein is electrically isolated from the cold plate via a thin dielectric layer. And in some variations, the thin dielectric layer is a CVD dielectric layer.

Figure 1A:
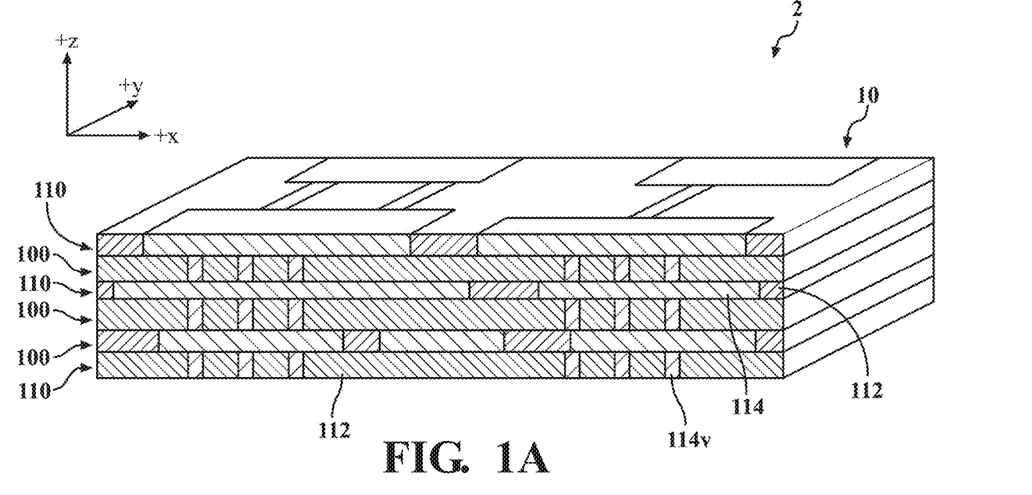
FIG. 1A shows a perspective view of a multi-layer PCB for a highly integrated power electronics embedded PCB-cold plate assembly according to the teachings of the present disclosure.
Figure 1B:
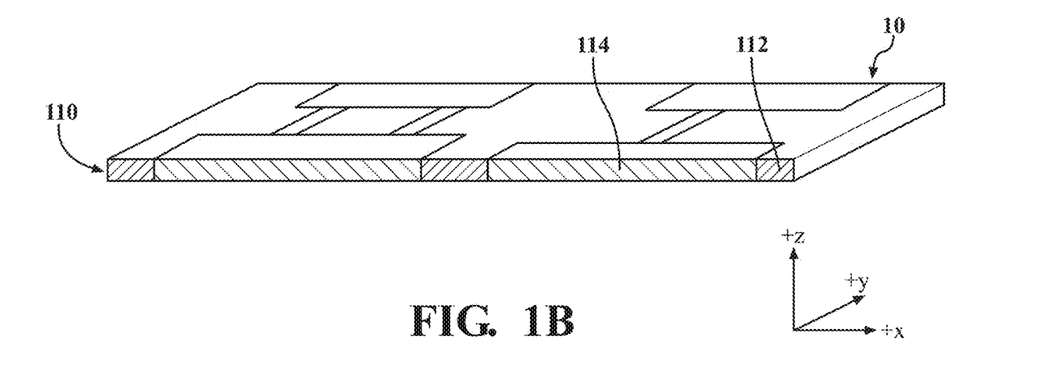
FIG. 1B shows a perspective for a power layer of the multi-layer PCB in FIG. 1A.

Referring now to FIGS. 1A-1B, a perspective cross-sectional view of a multi-layer PCB 10 is shown in FIG. 1A and an isolated perspective cross-sectional view of a power layer 110 of the multi-layer PCB 10 is shown in FIG. 1B. The multi-layer PCB 10 includes a plurality of dielectric layers 100 and a plurality of the power layers 110. The power layers 110 include a dielectric material 112 and a conductive material 114. In some variations, the power layers 110 are formed from a glass reinforced epoxy laminate dielectric material (e.g., FR-4), or other dielectric material, with the conductive material 114 embedded therein. The dielectric layers 100 include the dielectric material 112 and conductive vias 114v that provide electrical communication or pathways between adjacent power layers 110. Stated differently, the power layers 110 include conductive (e.g., copper) patterns 114 (i.e., patterns formed from the conductive material 114) and the dielectric layers 100 include conductive (e.g., copper) pathways that connect the conductive patterns 114 such that the multi-layer PCB 10 functions and/or operates as desired.

It should be understood that the dielectric layers 100 and the power layers 110 have a predefined average thickness (z-direction). For example, in some variations, the predefined average thickness is between about 50 micrometers (μm) and about 250 μm, for example, between about 75 μm and about 200 μm. And in at least one variation, the predefined thickness is between about 75 μm and about 150 μm, for example, between about 80 μm and about 120 μm.

Figure 2:
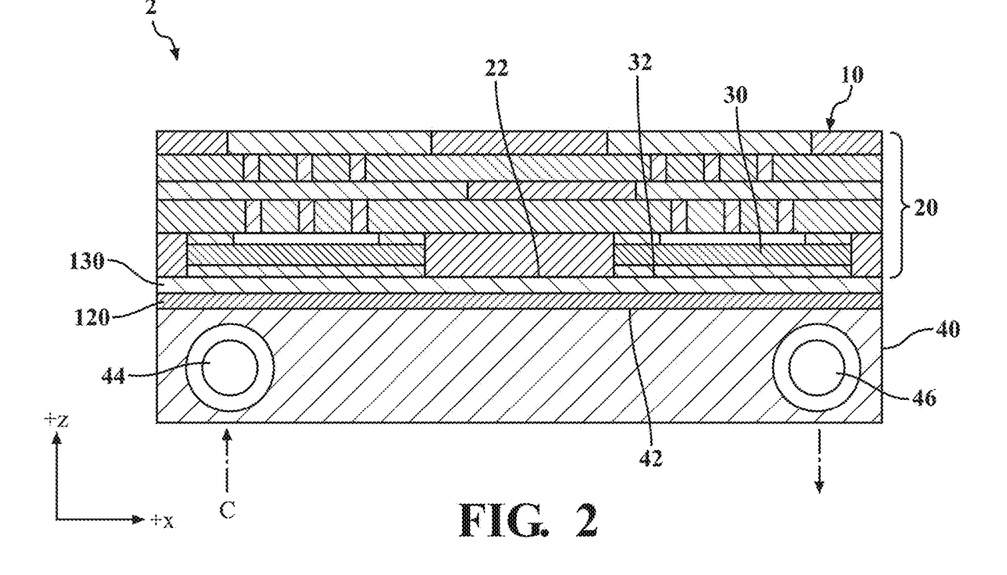
FIG. 2 shows a side view of a highly integrated power electronics embedded PCB-cold plate assembly according to one form of the present disclosure.

Referring to FIG. 2, a side view of a highly integrated power electronics embedded PCB-cold plate assembly 2 according to one form of the present disclosure is shown. The highly integrated power electronics embedded PCB-cold plate assembly 2 includes a power electronics embedded PCB 20 formed from the multi-layer PCB 10 with power device-substrate assemblies 30 embedded therein, and a cold plate 40. As used herein, the phrase power device-substrate assembly refers to a power device (e.g., a MOSFET power device) attached or bonded to a substrate. In some variations, the substrate is a copper-graphite substrate with a graphite core embedded within a shell of copper. And in such variations, the power device is bonded to the copper shell, e.g., via silver sintering.

The power electronics embedded PCB 20 is bonded to the cold plate 40 such that the power device assemblies 30 are in thermal communication with the cold plate 40. Accordingly, and during operation of the highly integrated power embedded PCB-cold plate assembly 2, the power device assemblies 30 are cooled via the flow of heat from the power device assemblies 30 to the cold plate 40. And in some variations, the cold plate 40 is formed form an electrically conductive material (e.g., aluminum) and it is desirable that a bonding interface (e.g., one or more bonding layers, isolation layers, etc.) between the power electronics embedded PCB 20 and the cold plate 40 exhibit desired electrical insulation and thermal conduction properties.

Still referring to FIG. 2, a CVD dielectric layer 120 and a bonding layer 130 are disposed between the cold plate 40 and the power electronics embedded PCB 20. For example, in some variations, the CVD dielectric layer 120 and the bonding layer 130 are disposed between an upper (+z direction) surface 42 of the cold plate 40 and a lower (−z direction) surface 22 of the power electronics embedded PCB 20. As used herein, the phrase "CVD dielectric layer" refers to a dielectric layer that has been formed on a surface using chemical vapor deposition (CVD). Also, in some variations, an upper surface of the CVD dielectric layer 120 is metalized (i.e., a metallization layer is applied) before being bonded to the power electronics embedded PCB 20 via the bonding layer 130.

In some variations, the CVD dielectric layer 120 is formed or deposited directly on the upper surface 42 of the cold plate 40, i.e., the CVD dielectric layer 120 is in direct contact with the upper surface 42, and the bonding layer 130 is in direct contact with the lower surface 22 of the power electronics embedded PCB 20. In other variations, the CVD dielectric layer 120 is in direct contact with the lower surface 22 (not shown) of the power electronics embedded PCB 20, and the bonding layer 130 is in direct contact with the upper surface 42 (not shown) of the cold plate 40. And in at least one variation, the one or more power device assemblies 30 form at least a portion of the lower surface 22 as illustrated in FIG. 2. For example, the power device assemblies 30 can be copper-graphite-copper (Cu-Gr-Cu) S-cell power devices with a lower Cu surface 32. Accordingly, the lower surface 22 of the power electronics embedded PCB 20 can include a dielectric portion and a metallic (e.g., Cu) portion. However, the lower Cu surface 32 of a power device assembly 30 is electrically isolated/insulated from the cold plate 40 via the CVD dielectric layer 120.

The CVD dielectric layer 120, and other CVD dielectric layers disclosed herein, can be formed from any dielectric material suitable for electronic circuitry and/or semiconductor component fabrication including silicon nitride ($Si_3N_4$), aluminum nitride (AlN), silicon oxide ($SiO_2$), and aluminum oxide ($Al_2O_3$), among others. Also, the CVD dielectric layer 120 can have a thickness between about 5 micrometers (μm) and about 100 μm, for example, between about 10 μm and about 50 μm, between about 15 μm and about 30 μm, or between about 20 μm and about 25 μm.

The bonding layer 130 can be formed from any bonding material suitable for electronic circuitry and/or semiconductor component fabrication including tin (Sn), copper (Cu), and silver (Ag), among others. Also, the bonding layer 130 can have a thickness between about 50 μm and about 250 μm, for example, between about 50 μm and about 200 μm, between about 50 μm and about 150 μm, or between about 75 μm and about 125 μm.

In some variations, the cold plate 40 includes a cooling or fluid chamber (not shown), and an inlet 44 and an outlet 46 in fluid communication with the fluid chamber such that a coolant flows through the cold plate 40 and extracts heat generated by the power device assemblies 30 during operation or use of the highly integrated power electronics embedded PCB-cold plate assembly 2. And with the combined CVD dielectric layer 120 and bonding layer 130, electrical insulation and enhanced thermal conduction between the power electronics embedded PCB 20 and the cold plate 40 is provided as discussed below.

Figure 3:
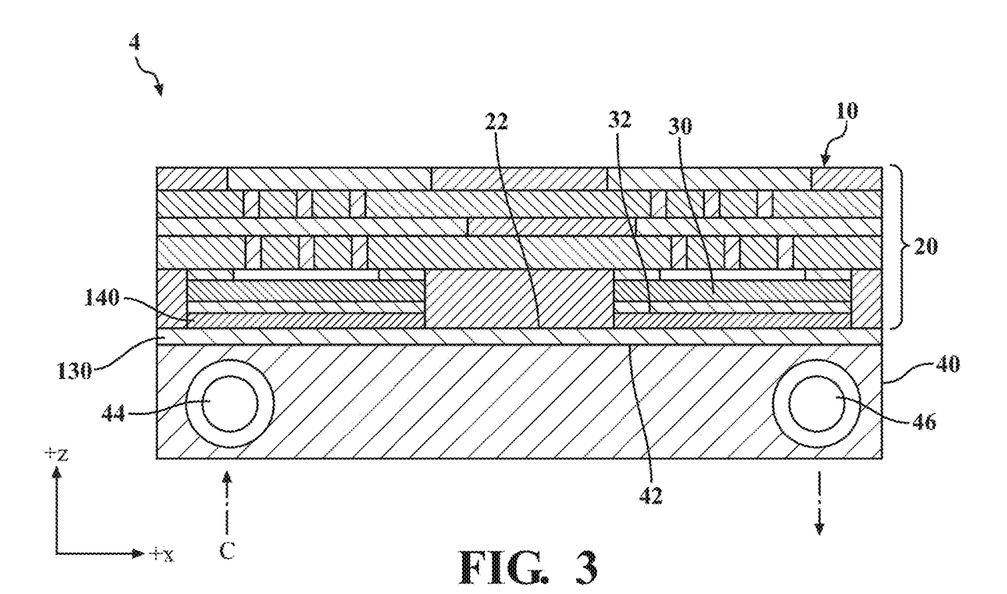
FIG. 3 shows a side view of a highly integrated power electronics embedded PCB-cold plate assembly according to another form of the present disclosure.

Referring to FIG. 3, a side view of a highly integrated power electronics embedded PCB-cold plate assembly 4 according to another form of the present disclosure is shown. The highly integrated power electronics embedded PCB-cold plate assembly 4 includes the power electronics embedded PCB 20 formed from the multi-layer PCB 10 with the power device assemblies 30 embedded therein, and the cold plate 40.

The power electronics embedded PCB 20 is bonded to the cold plate 40 such that the power device assemblies 30 are in thermal communication with the cold plate 40. However, and unlike the highly integrated power electronics embedded PCB-cold plate assembly 2 discussed above, the highly integrated power electronics embedded PCB-cold plate assembly 4 includes the bonding layer 130 disposed between the upper surface 42 of the cold plate 40 and a CVD dielectric layer 140 disposed between the power device assemblies 30 and the cold plate 40. Particularly, the power device assemblies 30 are embedded within the multi-layer PCB 10 such that a lower surface 32 of the power device assemblies 30 is not level or in alignment with the lower surface 22 of the power electronics embedded PCB 20. That is, the lower surface 32 of the power device assemblies 30 are spaced apart from the lower surface 22 of the power electronics embedded PCB 20 and the bonding layer 130. In addition, the CVD dielectric layer 140 is formed or deposited onto the lower surface 32 of the power device assemblies 30 such that the CVD dielectric layer 140 and the lower surface 22 of the power electronics embedded PCB 20 are bonded to the cold plate 40 via the bonding layer 130. And in some variations, the lower (−z direction) surface of the CVD dielectric layer 140 is metallized before being bonded to the cold plate 40 via the bonding layer 130.

In some variations, the CVD dielectric layer 140 is formed or deposited directly on the lower surface 32 of the power device assemblies 30, i.e., the CVD dielectric layer 140 is in direct contact with the lower surface 32, and the bonding layer 130 is in direct contact with the upper surface 42 of the cold plate 40. And in at least one variation, the bonding layer 130 is in direct contact with the upper surface 42 of the cold plate 40, the lower surface 22 of the power electronics embedded PCB 20, and the CVD dielectric layer 140. And with the combined CVD dielectric layer 140 and bonding layer 130, electrical insulation and enhanced thermal conduction between the power electronics embedded PCB 20 and the cold plate 40 is provided.

Figure 4:
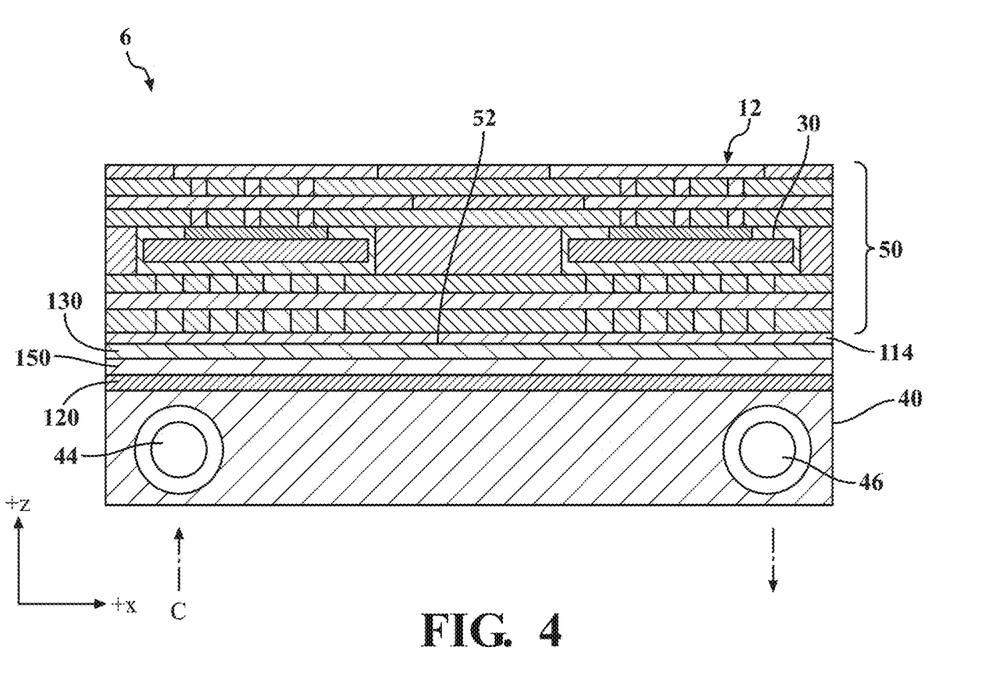
FIG. 4 shows a side view of a highly integrated power electronics embedded PCB-cold plate assembly according to still another form of the present disclosure.

Referring to FIG. 4, a side view of a highly integrated power electronics embedded PCB-cold plate assembly 6 according to still another form of the present disclosure is shown. The highly integrated power electronics embedded PCB-cold plate assembly 6 includes a power electronics embedded PCB 50 formed from a multi-layer PCB 12 with power device assemblies 30 completely embedded therein. That is, the power electronics embedded PCB 50 includes one more dielectric layers 100 and/or power layers 110 above (+z direction) the power device assemblies 30 and one more dielectric layers 100 and/or power layers 110 below (−z direction) the power devices. And in some variations, the power electronics embedded PCB 50 has a bottom (−z direction) layer of the conductive material 114.

The highly integrated power electronics embedded PCB-cold plate assembly 6 also includes a cold plate 40 and the power electronics embedded PCB 50 is bonded to the cold plate 40 such that the one or more power device assemblies 30 are in thermal communication with the cold plate 40. Particularly, a CVD dielectric layer 120, a bonding layer 130, and a metallization layer 150 are disposed between the upper surface 42 of the cold plate 40 and a lower surface 52 of the power electronics embedded PCB 50 such that the power electronics embedded PCB 20 is attached to the cold plate 40 and heat from the power device assemblies 30 flows to and is extracted by the cold plate 40.

In some variations, the CVD dielectric layer 120 is formed or deposited directly on the upper surface 42 of the cold plate 40, i.e., the CVD dielectric layer 120 is in direct contact with the upper surface 42, and the bonding layer 130 is in direct contact with the lower surface 52 of the power electronics embedded PCB 50. In at least one variation, the metallization layer 150 is sandwiched between the CVD dielectric layer 120 and the bonding layer 130, and in some variations the metallization layer 150 is in direct contact with the CVD dielectric layer 120 and/or the bonding layer 130.

In order to better illustrate the effectiveness of the highly integrated power electronics embedded PCB-cold plate assemblies disclosed herein, but not limit the scope thereof in any manner, results of thermal simulations for the highly integrated power electronics embedded PCB-cold plate assemblies 2 and 6 are provided and discussed below.

Referring to FIGS. 5A-5D, thermal simulation results for the highly integrated power electronics embedded PCB-cold plate assembly 2 with a $Si_3N_4$ CVD dielectric layer 120 (FIGS. 5A-5B) and an AlN CVD dielectric layer 120 (FIGS. 5C-5D) are shown. The highly integrated power electronics embedded PCB-cold plate assembly 2 included a power electronics embedded PCB 20 with six (6) power device assemblies 30, the $Si_3N_4$ and AlN CVD dielectric layers had a thickness of 20 μm, and the bonding layer 130 had a thickness of 100 μm. Also, the $Si_3N_4$ CVD dielectric layer 120 was simulated with a thermal conductivity of 20 W/m*K, the AlN CVD dielectric layer 120 was simulated with a thermal conductivity of 180 W/m*K, and the highly integrated power electronics embedded PCB-cold plate assembly 2 was simulated as operating with six (6) MOSFET power devices and each MOSFET power device had a heat loss level of 286 W.

Figure 5A:
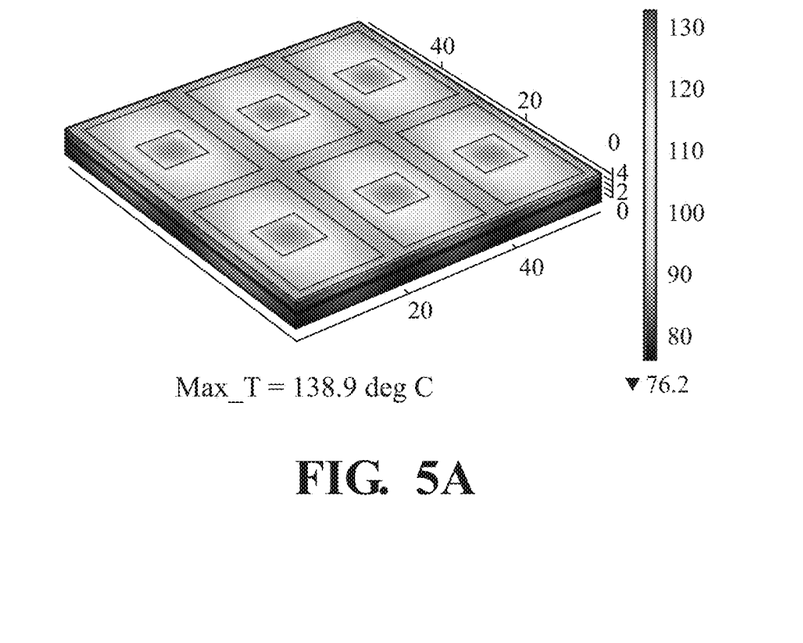
FIG. 5A shows a thermal simulation heat map for the highly integrated power electronics embedded PCB-cold plate assembly in FIG. 2 with a $Si_3N_4$ CVD dielectric layer and a 10 W/m*K bonding layer between the integrated power electronics embedded PCB and the cold plate.
Figure 5B:
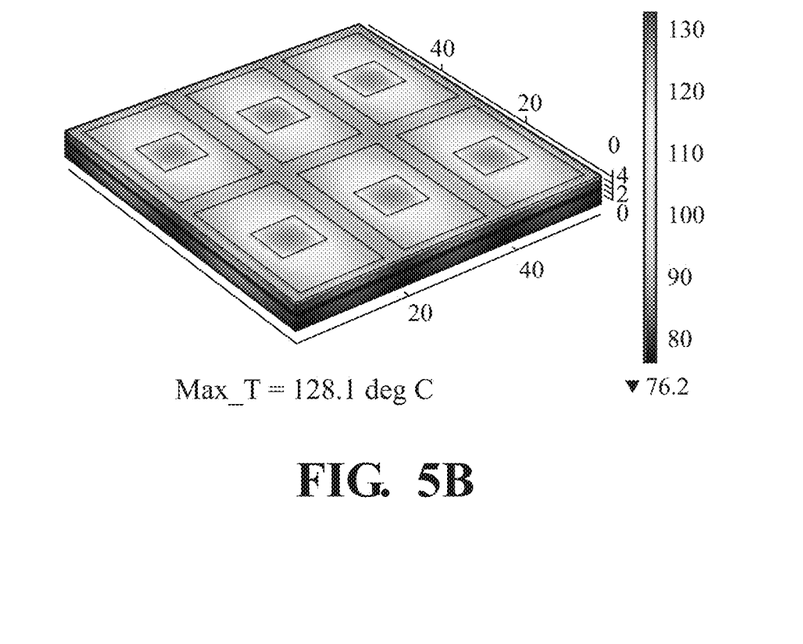
FIG. 5B shows a thermal simulation heat map for the highly integrated power electronics embedded PCB-cold plate assembly in FIG. 2 with a $Si_3N_4$ CVD dielectric layer and a 50 W/m*K bonding layer between the integrated power electronics embedded PCB and the cold plate.
Figure 5C:
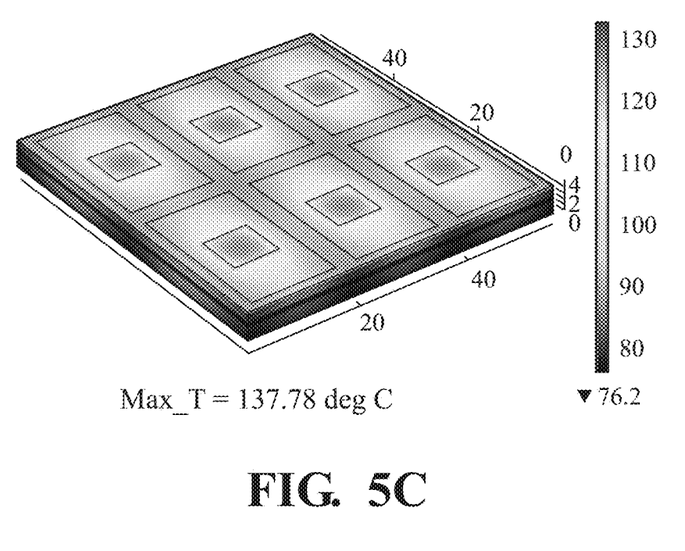
FIG. 5C shows a thermal simulation heat map for the highly integrated power electronics embedded PCB-cold plate assembly in FIG. 2 with an AlN CVD dielectric layer and a 10 W/m*K bonding layer between the integrated power electronics embedded PCB and the cold plate.
Figure 5D:
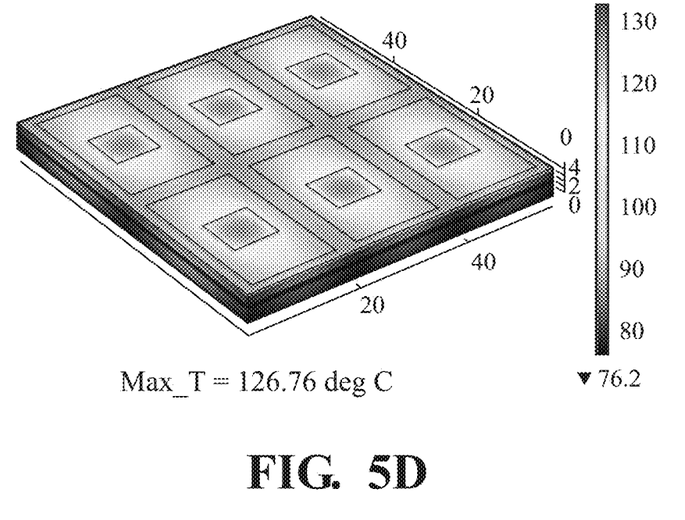
FIG. 5D shows a thermal simulation heat map for the highly integrated power electronics embedded PCB-cold plate assembly in FIG. 2 with an AlN CVD dielectric layer and a 50 W/m*K bonding layer between the integrated power electronics embedded PCB and the cold plate.

Regarding the highly integrated power electronics embedded PCB-cold plate assembly 2 with the $Si_3N_4$ CVD dielectric layer 120, FIG. 5A shows the thermal simulation result with the bonding layer 130 having a thermal conductivity 10 W/m*K and FIG. 5B shows the thermal simulation result with the bonding layer 130 having a thermal conductivity 50 W/m*K. And regarding the highly integrated power electronics embedded PCB-cold plate assembly 2 with the AlN CVD dielectric layer 120, FIG. 5C shows the thermal simulation result with the bonding layer 130 having a thermal conductivity of 10 W/m*K and FIG. 5D shows the thermal simulation result with the bonding layer 130 having a thermal conductivity of 50 W/m*K.

The highly integrated power electronics embedded PCB-cold plate assembly 2 with the $Si_3N_4$ CVD dielectric layer 120 and the 10 W/m*K bonding layer 130 had a maximum operating temperature of about 139° C. (FIG. 5A), the highly integrated power electronics embedded PCB-cold plate assembly 2 with the $Si_3N_4$ CVD dielectric layer 120 and the 50 W/m*K bonding layer 130 had a maximum operating temperature of about 128° C. (FIG. 5B), the highly integrated power electronics embedded PCB-cold plate assembly 2 with the AlN CVD dielectric layer 120 and the 10 W/m*K bonding layer 130 had a maximum operating temperature of about 138° C. (FIG. 5C), and the highly integrated power electronics embedded PCB-cold plate assembly 2 with the AlN CVD dielectric layer 120 and the 50 W/m*K bonding layer 130 had a maximum operating temperature of about 127° C. (FIG. 5D).

In contrast, thermal simulation of the highly integrated power electronics embedded PCB-cold plate assembly 2 with the power electronics embedded PCB 20 laminated on the cold plate 40 using a thin insulated metal substrate (IMS) (not shown) under the same conditions had a maximum operating temperature of about 141° C. Accordingly, and even though the CVD dielectric layer 120 has a relatively low thermal conductivity, the CVD dielectric layer 120 in combination with the bonding layer 130 provided enhanced heat transfer compared to an IMS layer. Particularly, the highly integrated power electronics embedded PCB-cold plate assemblies 2 with 50 W/m*K bonding layers 130 (FIGS. 5B, 5D) had maximum operating temperatures between about 12 to 14° C. less than the highly integrated power electronics embedded PCB-cold plate assemblies 2 with the IMS layer (not shown).

Figure 6A:
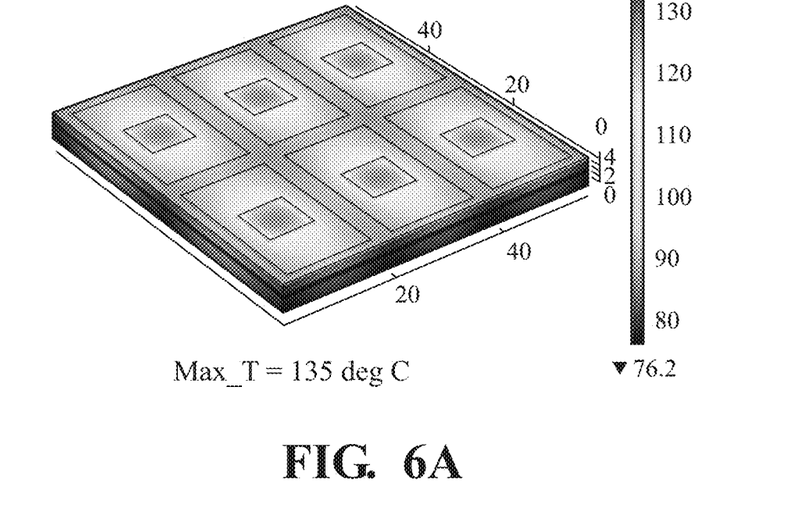
FIG. 6A shows a thermal simulation heat map for the highly integrated power electronics embedded PCB-cold plate assembly in FIG. 4 with a Sn-based soldering layer, a metallization layer, and a $Si_3N_4$ CVD dielectric layer between the integrated power electronics embedded PCB and the cold plate.
Figure 6B:
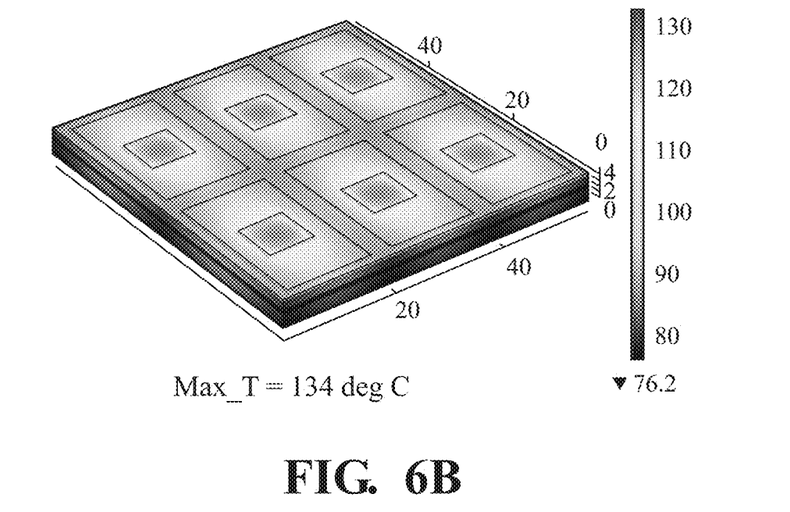
FIG. 6B shows a thermal simulation heat map for the highly integrated power electronics embedded PCB-cold plate assembly in FIG. 4 with a Sn-based soldering layer, a metallization layer, and an AlN CVD dielectric layer between the integrated power electronics embedded PCB and the cold plate.

Referring to FIGS. 6A-6B, thermal simulation results for the highly integrated power electronics embedded PCB-cold plate assembly 6 with a $Si_3N_4$ CVD dielectric layer 120 (FIG. 6A) and an AlN CVD dielectric layer 120 (FIG. 6B) are shown. The highly integrated power electronics embedded PCB-cold plate assembly 6 included a power electronics embedded PCB 50 with six (6) power device assemblies 30, the CVD dielectric layer 120 had a thickness of 20 μm, the bonding layer 130 had a thickness of 100 μm, and the metallization layer 150 had a thickness of 20 μm. Also, the $Si_3N_4$ CVD dielectric layer 120 was simulated with a thermal conductivity of 20 W/m*K, the AlN CVD dielectric layer 120 was simulated with a thermal conductivity of 180 W/m*K, and the metallization layer 150 was not included in the simulation since its presence was assumed negligible with respect to heat loss or heat flow resistance. And similar to the simulation of the highly integrated power electronics embedded PCB-cold plate assembly 2, the highly integrated power electronics embedded PCB-cold plate assembly 6 was simulated with six MOSFET power devices each having a heat loss of 286 W.

FIG. 6A shows the thermal simulation results of the power electronics embedded PCB-cold plate assembly 6 with a $Si_3N_4$ CVD dielectric layer and the bonding layer 130 having a thermal conductivity 63 W/m*K and FIG. 6B shows the thermal simulation results of the power electronics embedded PCB-cold plate assembly 6 with an AlN CVD dielectric layer and the bonding layer 130 having a thermal conductivity 63 W/m*K. In addition, the highly integrated power electronics embedded PCB-cold plate assembly 6 with the $Si_3N_4$ CVD dielectric layer 120 had a maximum operating temperature of about 135° C. (FIG. 6A) and the highly integrated power electronics embedded PCB-cold plate assembly 6 with the AlN CVD dielectric layer 120 had a maximum operating temperature of about 134° C. (FIG. 6B).

In contrast, thermal simulation of the highly integrated power electronics embedded PCB-cold plate assembly 6 with the power electronics embedded PCB 20 laminated on the cold plate 40 using an AlN dielectric layer sandwiched between a pair of grease layers (not shown) under the same conditions had a maximum operating temperature of about 166° C. Accordingly, and even though the CVD dielectric layer 120 has a relatively low thermal conductivity, the CVD dielectric layer 120 in combination with the bonding layer 130 and metallization layer 150 provided enhanced heat transfer compared to the grease-AlN-grease layers. Particularly, the highly integrated power electronics embedded PCB-cold plate assemblies 6 with the CVD dielectric layers 120 had maximum operating temperatures between about 41 to 42° C. less than the highly integrated power electronics embedded PCB-cold plate assemblies 6 with grease-AlN-grease layers.

Figure 7:
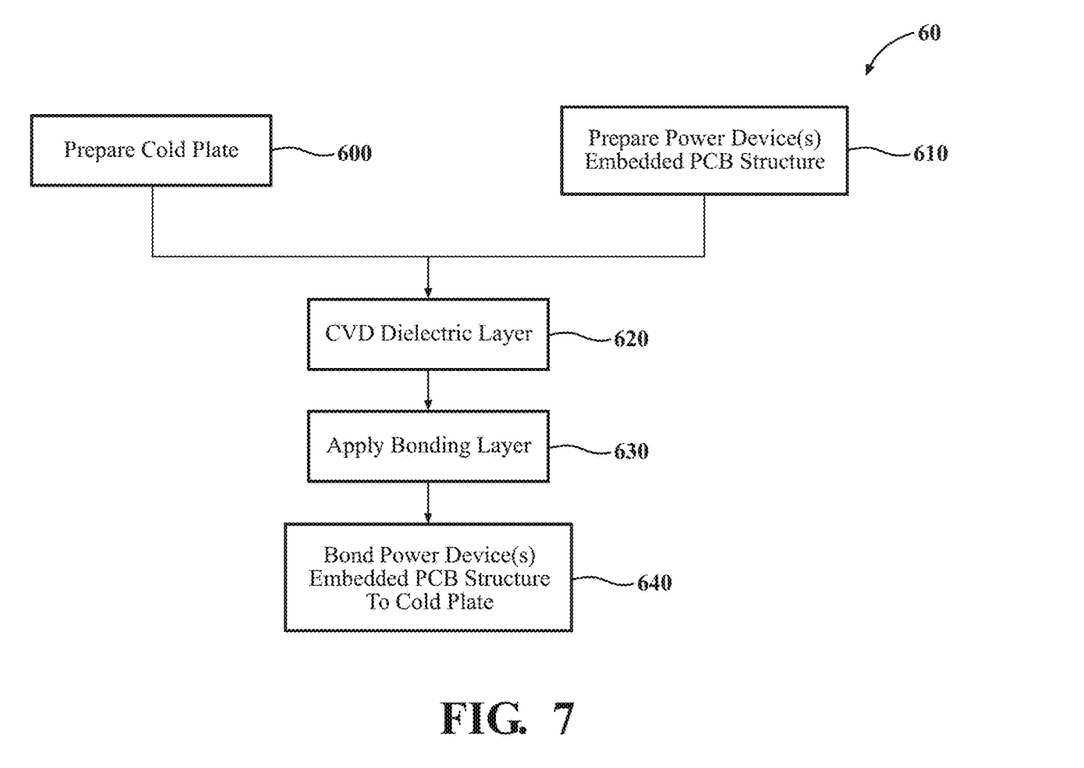
FIG. 7 is a flow chart for a method of manufacturing a highly integrated power electronics embedded PCB-cold plate assembly according to one form of the present disclosure.

Referring now to FIG. 7, a flow chart for a method 60 of manufacturing the highly integrated power electronics embedded PCB-cold plate assembly 2 is shown. The method 60 includes preparing the cold plate 40 at 600 and preparing the power electronics embedded PCB 20 at 610. A CVD dielectric layer 120 is formed on the cold plate 40 at 620 and a bonding layer 130 is applied on the lower surface 22 of the power electronics embedded PCB 20 or an upper surface of the CVD dielectric layer 120 at 630. And while not shown in FIG. 7, in some variations, a metallization layer is applied to the upper surface of the CVD dielectric layer between steps 620 and 630.

In the alternative the bonding layer 130 can be formed on the cold plate 40 at 620 and the CVD dielectric layer 120 can be applied on the lower surface 22 of the power electronics embedded PCB 20 at 630. And while not shown in FIG. 7, in some variations, a metallization layer is applied to the lower surface of the CVD dielectric layer between steps 620 and 630.

At 640, the power electronics embedded PCB 20 is bonded to the cold plate 40. In some variations, the power electronics embedded PCB 20 is bonded to the cold plate 40 by the application of heat and/or pressure such that the CVD dielectric layer 120 and the bonding layer 130 bond to each other such that the power device assemblies 30 are in thermal communication with the cold plate 40 as discussed above.

Figure 8:
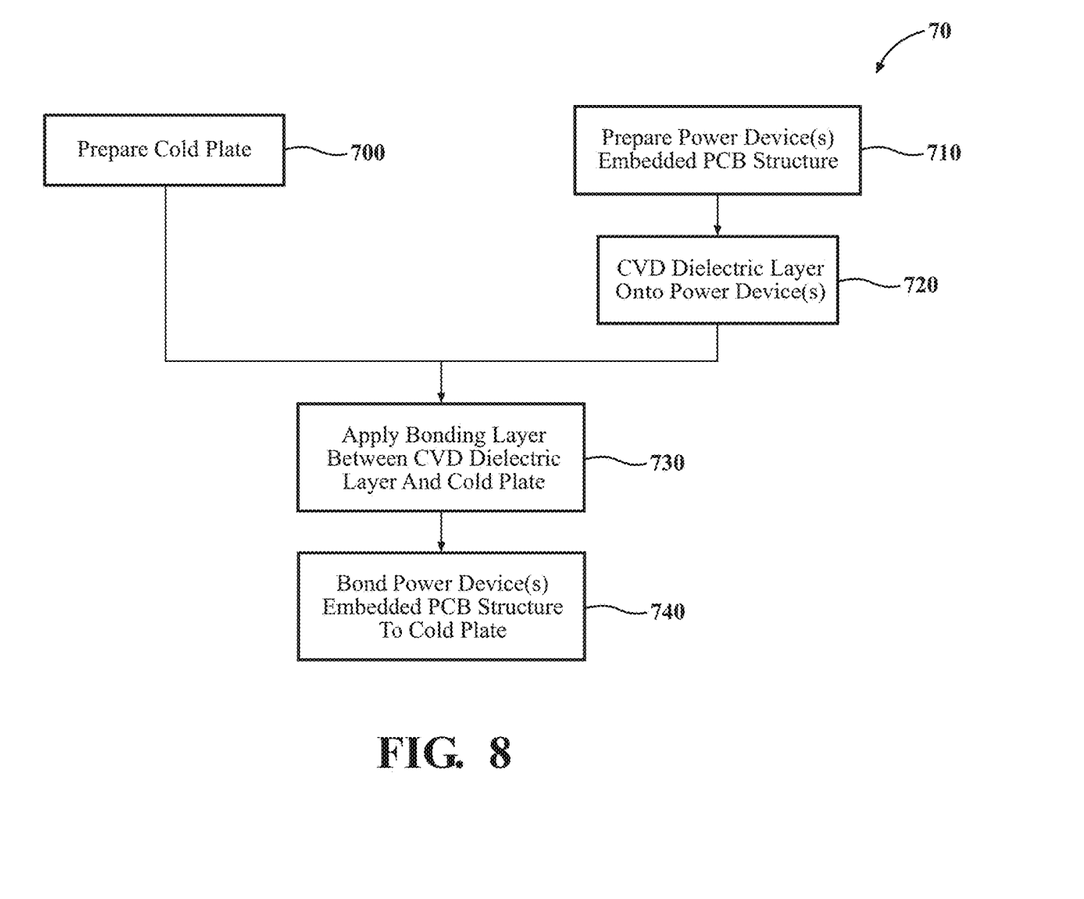
FIG. 8 is a flow chart for a method of manufacturing a highly integrated power electronics embedded PCB-cold plate assembly according to another form of the present disclosure.

Referring to FIG. 8, a flow chart for a method 70 of manufacturing the highly integrated power electronics embedded PCB-cold plate assembly 4 is shown. The method 70 includes preparing the cold plate 40 at 700 and preparing the power electronics embedded PCB 20 at 710. A CVD dielectric layer 140 is formed on a lower surface 32 of the power device assemblies 30 at 720 and a bonding layer 130 is applied on the upper surface 42 of the cold plate 40 at 730. And while not shown in FIG. 8, in some variations, a metallization layer is applied to the lower surface of the CVD dielectric layer between steps 720 and 730. Then, the power electronics embedded PCB 20 is bonded to the cold plate 40 at 740. In some variations, the power electronics embedded PCB 20 is bonded to the cold plate 40 by the application of heat and/or pressure such that the CVD dielectric layer 140 (with or without the metallization layer) and the bonding layer 130 bond to each other such that the power device assemblies 30 are in thermal communication with the cold plate 40 as discussed above.

Figure 9:
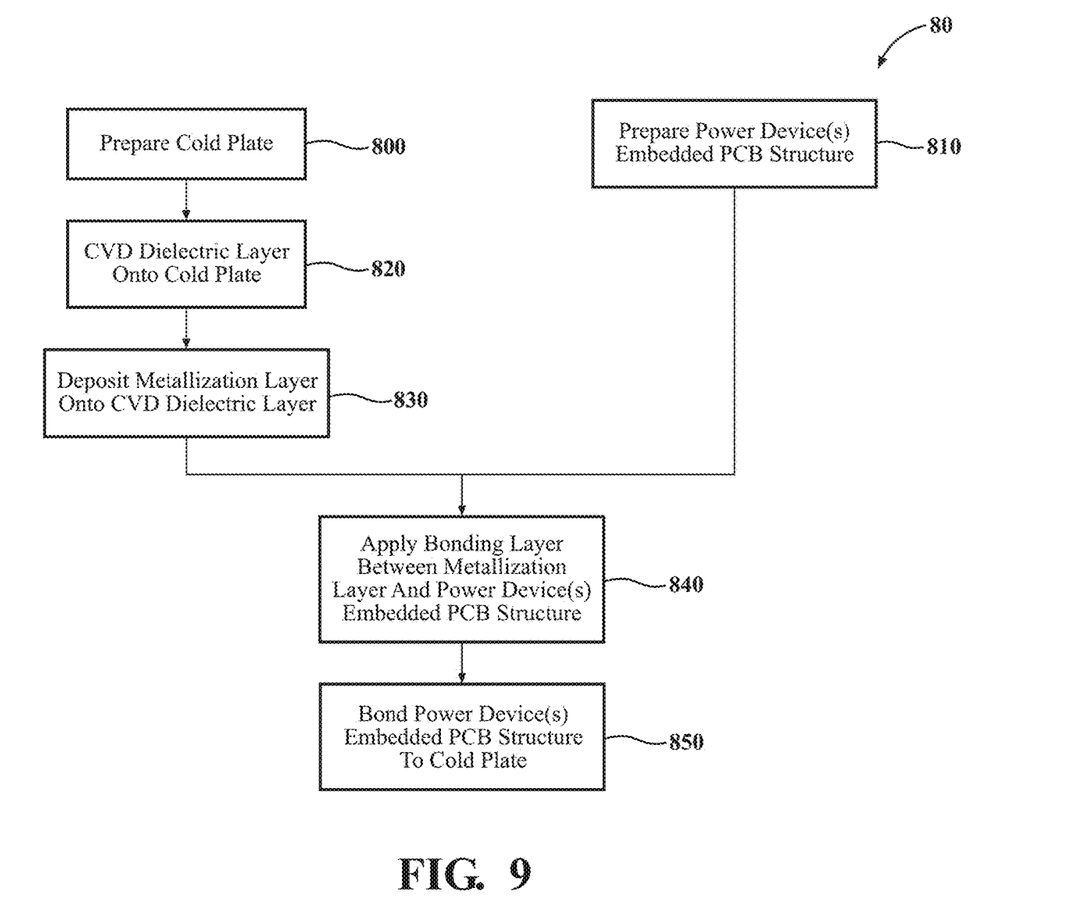
FIG. 9 is a flow chart for a method of manufacturing a highly integrated power electronics embedded PCB-cold plate assembly according to still another form of the present disclosure.

Referring to FIG. 9, a flow chart for a method 80 of manufacturing the highly integrated power electronics embedded PCB-cold plate assembly 6 is shown. The method 80 includes preparing the cold plate 40 at 800 and preparing the power electronics embedded PCB 50 at 810. A CVD dielectric layer 120 is formed on the cold plate 40 at 820, a metallization layer 150 is formed on the CVD dielectric layer 120 at 830, and a bonding layer 130 is formed on the power electronics embedded PCB 50 at 840. Then, the power electronics embedded PCB 50 is bonded to the cold plate 40 at 850. In some variations, the power electronics embedded PCB 50 is bonded to the cold plate 40 by the application of heat and/or pressure such that the metallization layer 150 and the bonding layer 130 bond to each other such that the power device assemblies 30 are in thermal communication with the cold plate 40 as discussed above.

The preceding description is merely illustrative in nature and is in no way intended to limit the disclosure, its application, or its uses. Work of the presently named inventors, to the extent it may be described in the background section, as well as aspects of the description that may not otherwise qualify as prior art at the time of filing, are neither expressly nor impliedly admitted as prior art against the present technology.

The blocks in FIGS. 7-9 illustrate the architecture, functionality, and operation of possible implementations of systems, and methods and according to various forms or aspects of the present disclosure. In this regard, each block in a flow chart may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for the general organization of topics within the present disclosure and are not intended to limit the disclosure of the technology or any aspect thereof. The recitation of multiple variations or forms having stated features is not intended to exclude other variations or forms having additional features, or other variations or forms incorporating different combinations of the stated features.

As used herein the term "about" when related to numerical values herein refers to known commercial and/or experimental measurement variations or tolerances for the referenced quantity. In some variations, such known commercial and/or experimental measurement tolerances are +/−10% of the measured value, while in other variations such known commercial and/or experimental measurement tolerances are +/−5% of the measured value, while in still other variations such known commercial and/or experimental measurement tolerances are +/−2.5% of the measured value. And in at least one variation, such known commercial and/or experimental measurement tolerances are +/−1% of the measured value.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC, or ABC).

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that a form or variation can or may comprise certain elements or features does not exclude other forms or variations of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one variation, or various variations means that a particular feature, structure, or characteristic described in connection with a form or variation or particular system is included in at least one variation or form. The appearances of the phrase "in one variation" (or variations thereof) are not necessarily referring to the same variation or form. It should also be understood that the various method steps discussed herein do not have to be conducted in the same order as depicted, and not each method step is required in each variation or form.

The foregoing description of the forms and variations has been provided for purposes of illustration and description. It is not intended to be exhaustive or to limit the disclosure. Individual elements or features of a particular form or variation are generally not limited to that particular form or variation, but, where applicable, are interchangeable and can be used in a selected form or variation, even if not specifically shown or described. The same may also be varied in many ways. Such variations should not be regarded as a departure from the disclosure, and all such modifications are intended to be included within the scope of the disclosure.

What is claimed is:

1. A power device embedded printed circuit board (PCB) assembly comprising:
a cold plate;
a multi-layer PCB with at least one power device embedded therein bonded to and in thermal communication with the cold plate; and
a chemical vapor deposition (CVD) dielectric layer and a bonding layer disposed between the cold plate and the multi-layer PCB.

2. The power device embedded PCB assembly according to claim 1, wherein the CVD dielectric layer is selected from the group consisting of a $Si_3N_4$ CVD dielectric layer, an AlN CVD dielectric layer, a $SiO_2$ CVD dielectric layer, and an $Al_2O_3$ CVD dielectric layer.

3. The power device embedded PCB assembly according to claim 1, wherein the bonding layer is sandwiched between the multi-layer PCB and the CVD dielectric layer.

4. The power device embedded PCB assembly according to claim 3, wherein the bonding layer is in direct contact with the multi-layer PCB.

5. The power device embedded PCB assembly according to claim 4, wherein the bonding layer is in direct contact with the CVD dielectric layer.

6. The power device embedded PCB assembly according to claim 5, wherein the at least one power device is in direct contact with the bonding layer.

7. The power device embedded PCB assembly according to claim 6, wherein the CVD dielectric layer is in direct contact with the cold plate.

8. The power device embedded PCB assembly according to claim 1, wherein the CVD dielectric layer is sandwiched between the at least one power device and the bonding layer.

9. The power device embedded PCB assembly according to claim 8, wherein the CVD dielectric layer is in direct contact with the at least one power device.

10. The power device embedded PCB assembly according to claim 9, wherein the CVD dielectric layer is in direct contact with the bonding layer.

11. The power device embedded PCB assembly according to claim 10, wherein the bonding layer is in direct contact with the cold plate.

12. The power device embedded PCB assembly according to claim 1 further comprising a metallization layer disposed between the cold plate and the multi-layer PCB.

13. The power device embedded PCB assembly according to claim 12, wherein the metallization layer is sandwiched between the CVD dielectric layer and the bonding layer.

14. The power device embedded PCB assembly according to claim 13, wherein the CVD dielectric layer is in direct contact with the cold plate.

15. The power device embedded PCB assembly according to claim 14, wherein the bonding layer is in direct contact with the multi-layer PCB and the metallization layer is in direct contact with the CVD dielectric layer and the bonding layer.

16. A power device embedded printed circuit board (PCB) assembly comprising:
    a cold plate;
    a multi-layer PCB with at least one power device embedded therein bonded to and in thermal communication with the cold plate; and
    a chemical vapor deposition (CVD) dielectric layer and a bonding layer disposed between the cold plate and the multi-layer PCB, the CVD dielectric layer having a thickness between about 5 μm and about 100 μm.

17. The power device embedded PCB assembly according to claim 16, wherein the CVD dielectric layer is direct contact with and bonded to the cold plate, the bonding layer is in direct with and bonded to the multi-layer PCB, and the CVD dielectric layer and the bonding layer are in direct contact with and bonded to each other.

18. The power device embedded PCB assembly according to claim 16 further comprising a metallization layer, wherein the CVD dielectric layer is in direct contact with and bonded to the cold plate, the bonding layer is in direct with and bonded to the multi-layer PCB, and the metallization layer is in direct contact with and bonded to the CVD dielectric layer and the bonding layer.

19. A power device embedded printed circuit board (PCB) assembly comprising:
    a cold plate;
    a multi-layer PCB with at least one power device embedded therein bonded to and in thermal communication with the cold plate; and
    a bonding interface between and bonding the cold plate to the multi-layer PCB, the bonding interface comprising a chemical vapor deposition (CVD) dielectric layer and a bonding layer.

20. The power device embedded PCB assembly according to claim 19, wherein the CVD dielectric layer is direct contact with and bonded to the cold plate and the bonding layer is in direct with and bonded to the multi-layer PCB.

* * * * *